United States Patent
Kim et al.

(10) Patent No.: US 10,680,005 B2
(45) Date of Patent: Jun. 9, 2020

(54) NONVOLATILE MEMORY DEVICE, METHOD OF OPERATING NONVOLATILE MEMORY DEVICE AND STORAGE DEVICE INCLUDING THE SAME

(71) Applicant: Samsung Electronics Co., Ltd., Suwon-si, Gyeonggi-do (KR)

(72) Inventors: Seung-Bum Kim, Hwaseong-si (KR); Chan-Ho Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/108,302

(22) Filed: Aug. 22, 2018

(65) Prior Publication Data

US 2019/0198514 A1 Jun. 27, 2019

(30) Foreign Application Priority Data

Dec. 26, 2017 (KR) .................. 10-2017-0179476

(51) Int. Cl.
*G11C 29/00* (2006.01)
*H01L 27/11551* (2017.01)
(Continued)

(52) U.S. Cl.
CPC ........ *H01L 27/11551* (2013.01); *G11C 5/025* (2013.01); *G11C 11/5628* (2013.01); *G11C 11/5635* (2013.01); *G11C 16/10* (2013.01); *G11C 16/3445* (2013.01); *G11C 29/42* (2013.01); *G11C 29/52* (2013.01); *G11C 29/76* (2013.01); *H01L 27/1157* (2013.01); *H01L 27/11578* (2013.01); *H01L 27/11582* (2013.01); *G11C 29/70* (2013.01); *G11C 29/88* (2013.01); *G11C 2029/0411* (2013.01); *G11C 2211/5621* (2013.01)

(58) Field of Classification Search
CPC ................................ G11C 29/70; G11C 29/88
USPC ........................................ 365/185.09, 185.11
See application file for complete search history.

(56) References Cited

U.S. PATENT DOCUMENTS 7,254,757 B2   8/2007   Park et al.
8,400,854 B2   3/2013   Pei et al.
(Continued)

FOREIGN PATENT DOCUMENTS

KR      10-0498509 B1      7/2005
KR      10-2005-0108978    11/2005

*Primary Examiner* — Son L Mai
(74) *Attorney, Agent, or Firm* — Harness, Dickey & Pierce, P.L.C.

(57) ABSTRACT

A nonvolatile memory device includes a memory cell array and a control circuit. The memory cell array includes a plurality of memory blocks, each including a plurality memory cells coupled to word-lines respectively, and the word-lines are stacked vertically on a substrate. The control circuit divides a first memory block of the plurality of memory blocks into a partial bad region and a partial normal region based on error information of an uncorrectable error of the first memory block which is designated as a bad block. The control circuit performs a memory operation on the partial normal region by applying a first bias condition to the partial bad region and by applying a second bias condition to the partial normal region, based on a command and an address, and the first bias condition is different from the second bias condition.

19 Claims, 19 Drawing Sheets

(51) Int. Cl.

| | | |
|---|---|---|
| *H01L 27/11578* | (2017.01) | |
| *G11C 5/02* | (2006.01) | |
| *G11C 29/42* | (2006.01) | |
| *G11C 16/34* | (2006.01) | |
| *G11C 29/52* | (2006.01) | |
| *G11C 16/10* | (2006.01) | |
| *G11C 11/56* | (2006.01) | |
| *H01L 27/11582* | (2017.01) | |
| *H01L 27/1157* | (2017.01) | |
| *G11C 29/04* | (2006.01) | |

(56) References Cited

U.S. PATENT DOCUMENTS

| | | |
|---|---|---|
| 9,007,836 B2 * | 4/2015 | Shirakawa ....... G11C 29/50004 |
| | | 365/185.17 |
| 9,135,111 B2 | 9/2015 | Oh et al. |
| 9,257,195 B2 | 2/2016 | Oh et al. |
| 9,312,026 B2 * | 4/2016 | Kochar .............. G11C 16/3445 |
| 9,378,824 B2 | 6/2016 | Byun |
| 9,455,048 B2 | 9/2016 | Berckmann et al. |
| 9,460,815 B2 | 10/2016 | Sivasankaran et al. |
| 9,542,286 B2 | 1/2017 | Bar et al. |
| 2015/0138885 A1 * | 5/2015 | Iwai ...................... G11C 16/08 |
| | | 365/185.09 |
| 2016/0019111 A1 | 1/2016 | Kochar et al. |
| 2016/0266955 A1 * | 9/2016 | Takeda ................... G06F 12/00 |
| 2017/0148529 A1 | 5/2017 | Kim et al. |

\* cited by examiner

FIG. 16

| MB1 | ERASE BIAS |
|---|---|
| SSL1 | GND |
| SSL2 | FLOAT |
| SSL3 | FLOAT |
| WL6~WL12 | Vwe |
| WL1~WL5 | Vwe |
| GSL1~GSL3 | FLOAT |
| NORMAL GSL | Vwe→FLOAT AT T1 |
| CSL/SUB | VERS |

FIG. 17

| MB1 | PROGRAM BIAS |
| --- | --- |
|  | WL9 PROGRAM |
| SSL1 | GND |
| SSL2 | VDD |
| SSL3 | VDD |
| WL12~WL10 | VPPASS1 |
| WL9 | VPGM |
| WL8~WL7 | VPPASS1 |
| WL6 | VPPASS1 |
| WL1~WL5 | VPPASS2 |
| GSL1~GSL3 | GND |
| NORMAL GSL | GND |

WL12~WL10, WL9, WL8~WL7 } N-bit(N < M)

1-bit OR SOLID PATTERN

FIG. 18

| MB1 | READ BIAS |
| --- | --- |
| | WL9 READ |
| SSL1 | GND |
| SSL2 | VDD |
| SSL3 | VDD |
| WL10~WL12 | VRPASS1 |
| WL9 | VRD |
| WL6~WL8 | VRPASS1 |
| WL1~WL5 | VRPASS2 |
| GSL1~GSL3 | GND |
| NORMAL GSL | GND | ations # NONVOLATILE MEMORY DEVICE, METHOD OF OPERATING NONVOLATILE MEMORY DEVICE AND STORAGE DEVICE INCLUDING THE SAME

CROSS-REFERENCE TO RELATED APPLICATION

This U.S. patent application claims priority under 35 USC § 119 to Korean Patent Application No. 10-2017-0179476, filed on Dec. 26, 2017, in the Korean Intellectual Property Office (KIPO), the disclosure of which is incorporated in its entirety by reference herein.

BACKGROUND

1. Technical Field

Example embodiments relate generally to memory devices. For example, at least some example embodiments relate to nonvolatile memory devices, methods of operating nonvolatile memory devices and/or storage devices including the same.

2. Discussion of the Related Art

Semiconductor memory devices may be volatile or nonvolatile. Flash memory devices are typically nonvolatile semiconductor memory devices. Flash memory devices may be used as a voice and image data storing medium for information appliances, such as a computer, a cellular phone, a PDA, a digital camera, a handheld PC, and the like.

Recently, nonvolatile memory devices having memory cells that are stacked in three dimensions have been researched to improve integrity of the nonvolatile memory devices. However, increases in storage capacity may cause various problems that may not match existing memory management policies.

SUMMARY

Some example embodiments relate to a nonvolatile memory device. In some example embodiments, the nonvolatile memory device includes a memory cell array including a plurality of memory blocks, the plurality of memory blocks including a plurality memory cells coupled to word-lines, the word-lines being stacked vertically on a substrate; and a controller configured to divide a first memory block of the plurality of memory blocks into a partial bad region and a partial normal region based on error information associated with an error in the first memory block such that the first memory block is designated as a bad block, and perform a memory operation on the partial normal region by applying a first bias condition to the partial bad region and applying a second bias condition to the partial normal region, based on a command and an address, the first bias condition being different from the second bias condition.

Some example embodiments relate to a method of operating a nonvolatile memory device, the nonvolatile memory device including a memory cell array having a plurality of memory blocks, each of the memory blocks including a plurality memory cells coupled to word-lines respectively, the word-lines being stacked vertically on a substrate. In some example embodiments, the method includes dividing a first memory block of the plurality of memory blocks into a partial bad region and a partial normal region based on error information associated with an error in the first memory block such that the first memory block is designated as a bad block; and performing a memory operation on the partial normal region by applying a first bias condition to the partial bad region and by applying a second bias condition to the partial normal region, based on an command and an address, the first bias condition being different from the second bias condition.

Some example embodiments relate to a storage device. In some example embodiments, the storage device includes a memory controller; and at least one nonvolatile memory device. The at least one nonvolatile memory device may include a memory cell array including a plurality of memory blocks, each including a plurality memory cells coupled to word-lines respectively, the word-lines being stacked vertically on a substrate; and a controller configured to, receive, from the memory controller, bad block information associated with an error in a first memory block of the plurality of memory blocks, the first memory block being designated as a bad block, divide the bad block into a partial bad region and a partial normal region based on the bad block information, and perform a memory operation on the partial normal region.

Accordingly, the nonvolatile memory device may reduce the probability of (or, alternatively, prevent) reduction of the lifetime due to bad block by repairing a portion of the bad block with a partial normal region without replacing the bad block with a reserved block.

BRIEF DESCRIPTION OF THE DRAWINGS

Illustrative, non-limiting example embodiments will be more clearly understood from the following detailed description in conjunction with the accompanying drawings.

FIG. 16 illustrates an erase bias condition when an erase operation is performed on the bad block.

FIG. 17 illustrates a program bias condition when a program operation is performed on the bad block.

FIG. 18 illustrates a read bias condition when a program operation is performed on the bad block.

DETAILED DESCRIPTION

Various example embodiments will be described more fully hereinafter with reference to the accompanying drawings, in which some example embodiments are shown.

Figure 1:
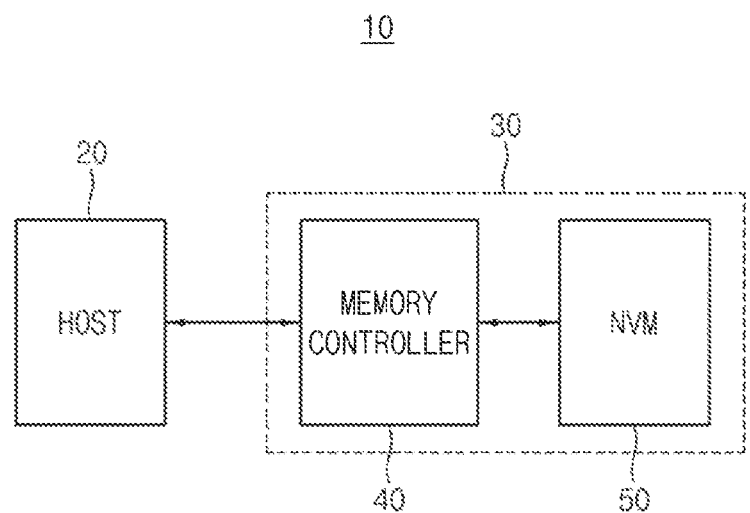
FIG. 1 is a block diagram illustrating an electronic device according to example embodiments.

FIG. 1 is a block diagram illustrating an electronic device according to example embodiments.

Referring to FIG. 1, an electronic device 10 may include a host 20 and a storage device 30. The storage device 30 may be also referred to as a memory system. The storage device 30 may include a memory controller 40 and at least one nonvolatile memory device 50. The host 20 may control overall operation of the storage device 30. The memory controller 40 may exchange the signals such as a command, an address, data, etc. with the host 20. The memory controller 40 may write data in the nonvolatile memory device 50 and reads data from the nonvolatile memory device 50 according to a command from the host 20.

Figure 2:
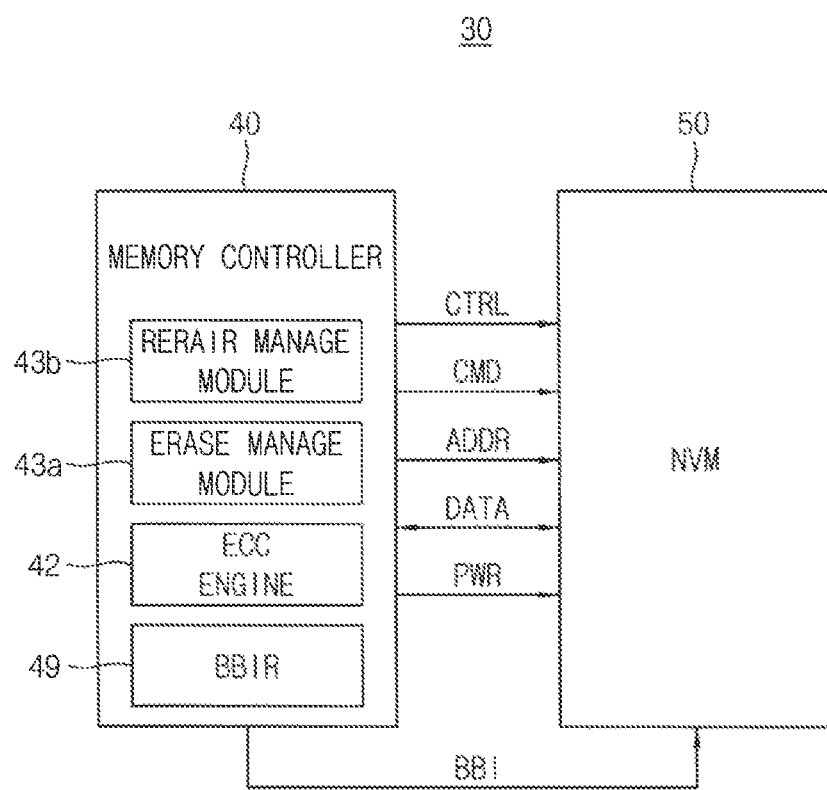
FIG. 2 is a block diagram illustrating the storage device in FIG. 1 according to example embodiments.

FIG. 2 is a block diagram illustrating the storage device in FIG. 1 according to example embodiments.

Referring to FIG. 2, the storage device 30 may include the memory controller 40 and the at least one nonvolatile memory device 50.

In example embodiments, each of the memory controller 40 and the nonvolatile memory device 50 may be provided in the form of a chip, a package, or a module. Alternatively, the memory controller 40 and the nonvolatile memory device 50 may be mounted on various packages to be provided as a storage device such as a memory card.

The nonvolatile memory device 50 may perform a read operation, an erase operation, and/or a program operation or a write operation under control of the memory controller 40. The nonvolatile memory device 50 receives a command CMD, an address ADDR and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

Memory cells of the nonvolatile memory device 50 may have the physical characteristic that a threshold voltage distribution varies due to causes, such as a program elapsed time, a temperature, program disturbance, read disturbance and etc. For example, data stored at the nonvolatile memory device 50 becomes erroneous due to the above causes. The memory controller 40 utilizes a variety of error correction techniques to correct such errors. For example, the memory controller 40 may include an error correction code (ECC) engine 42.

The memory controller 40 may perform an erase operation on the nonvolatile memory device 50 by sub-block unit, where the sub-block unit may be smaller than one memory block of the nonvolatile memory device 50. As an example, one memory block may include a plurality of sub-blocks. The memory controller 40 may include an erase manage module 43*a* to manage the erase operation by sub-block unit.

After a sub-block erase operation, the erase manage module 43*a* may check an erase status of an erased sub-block and/or a sub-block adjacent to the erased sub-block. For example, the erase manage module 43*a* may sense memory cells of the erased sub-block to determine whether specific parameters exceed a reference value. The erase manage module 43*a* may read data of sub-block(s) adjacent to the erased sub-block to detect erase-inhibition efficiency. For example, the erase manage module 43*a* may detect bit error rate (BER) based on data read from an erased sub-block. The erase manage module 43*a* may acquire and monitor wear-leveling information (e.g., erase count) on the erased sub-block.

Generally, a memory block is the maximum memory unit that may be erased at the same time. In a three-dimensional nonvolatile memory device, where word-lines are stacked in a direction intersecting (e.g., perpendicular to) a substrate, a memory block may be defined as a group of cell strings sharing all stacked word-lines. A sub-block corresponds to a sub-memory unit defined by dividing the memory block (or, physical block) by word line unit or selection line unit. For example, each sub-block may be formed of memory cells sharing a portion of the word-lines of the memory block.

During a read operation on the nonvolatile memory device 50, the memory controller 40 may read data stored at a first page of the nonvolatile memory device 50, using a default read voltage set. The default read voltage set may include desired (or, alternatively, predetermined) read voltages. The ECC engine 42 may detect and correct errors included in data read from the nonvolatile memory device 50. The ECC engine 42 may perform an ECC operation by detecting and correcting errors. In example embodiments, the ECC engine 42 may be implemented in the form of hardware. The ECC engine 42 may designate a memory block as a bad block, based on uncorrectable errors in data read from the nonvolatile memory device 50.

The memory controller 40 may include a bad block information register 49 that stores error information of the bad block. The memory controller 40 may store a first error information and a second error information in the bad block information register 49 as the error information. The first error information may be associated the uncorrectable errors of word-lines in the bad block and the second error information may be associated with the uncorrectable errors of cell strings in the bad block. The memory controller 40 may provide the nonvolatile memory device 50 with bad block information BBI including the error information.

The memory controller 40 may include a repair manage module 43*b* that uses a portion of the bad block as a partial normal region based on the error information. The repair manage module 43*b* may control the nonvolatile memory device 50 to perform a repair operation that uses the portion of the bad block as a partial normal region by referring to the error information stored in the bad block information register 49.

Figure 3:
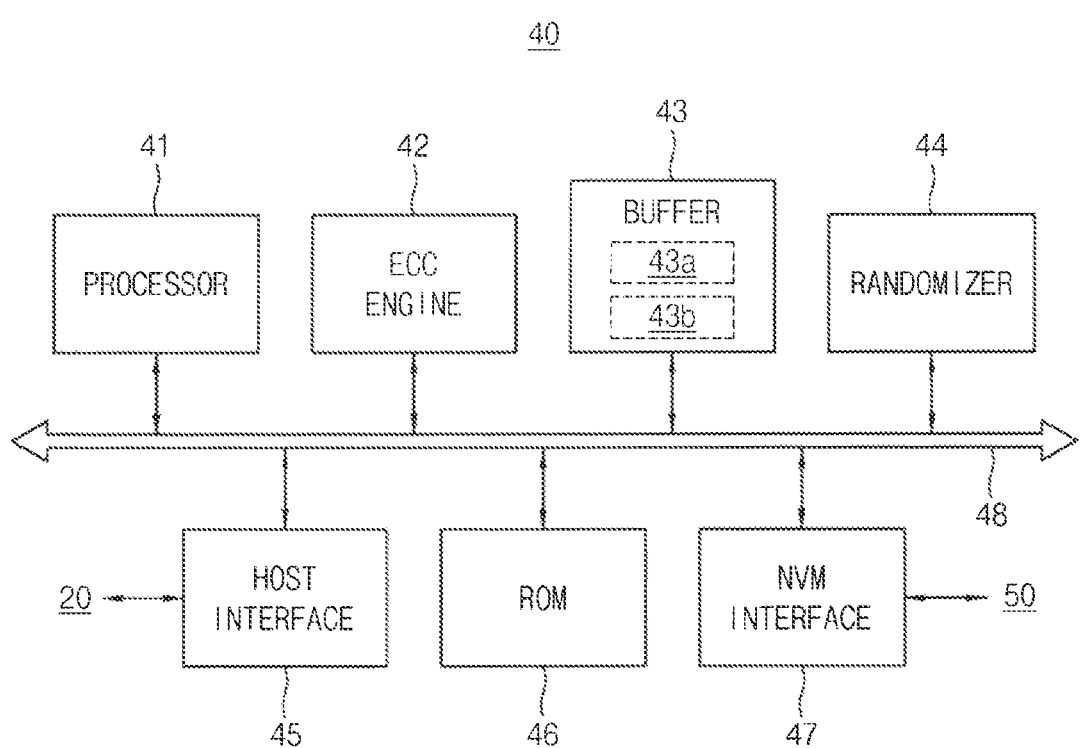
FIG. 3 is a block diagram illustrating the memory controller in the storage device of FIG. 2 according to example embodiments.

FIG. 3 is a block diagram illustrating the memory controller in the storage device of FIG. 2 according to example embodiments.

Referring to FIGS. 2 and 3, the memory controller 40 may include a processor 41, the ECC engine 42, the buffer 43, the erase manage module 43a, the repair manage module 43b, a randomizer 44, a host interface 45, a read only memory (ROM) 46 and a nonvolatile memory interface 47 which are connected via a bus 48. The ECC engine 42, the erase manage module 43a and the repair manage module 43b are described with reference to FIG. 2, and a description thereof is thus omitted.

The processor 41 controls an overall operation of the memory controller 40. In example embodiments, the processor 41 may execute instructions stored in, for example the buffer 43, that when executed, configure the processor 41 as a special purpose computer to implement the functions of the erase manage module 43a and the repair manage module 43b.

The buffer 43 may store data provided from the nonvolatile memory device 50 and may include the data associated with erase manage module 43a and the repair manage module 43b.

The ROM 46 stores a variety of information, needed for the memory controller 40 to operate, in firmware.

The randomizer 44 randomizes data to be stored in the nonvolatile memory device 50. For example, the randomizer 44 may randomize data to be stored in the nonvolatile memory device 50 in a unit of a word-line.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 de-randomizes data read from the nonvolatile memory device 50.

The randomizer 44 randomizes page data. For the sake of easy understanding, an ideal operation of the randomizer 44 is described. However, example embodiments are not limited thereto. For example, the randomizer 44 randomizes data such that in memory cells connected to one word-line, the number of memory cells having the erase state, the number of memory cells having the first program state, the number of memory cells having the second program state, and the number of memory cells having the third program state are approximate to the same value. For example, memory cells in which randomized data is stored have program states of which the number is similar to one another.

The memory controller 40 communicates with the host 20 through the host interface 45. For example, the host interface 45 may various interfaces. The memory controller 40 communicates with the nonvolatile memory device 50 through the nonvolatile memory interface 47.

Figure 4:
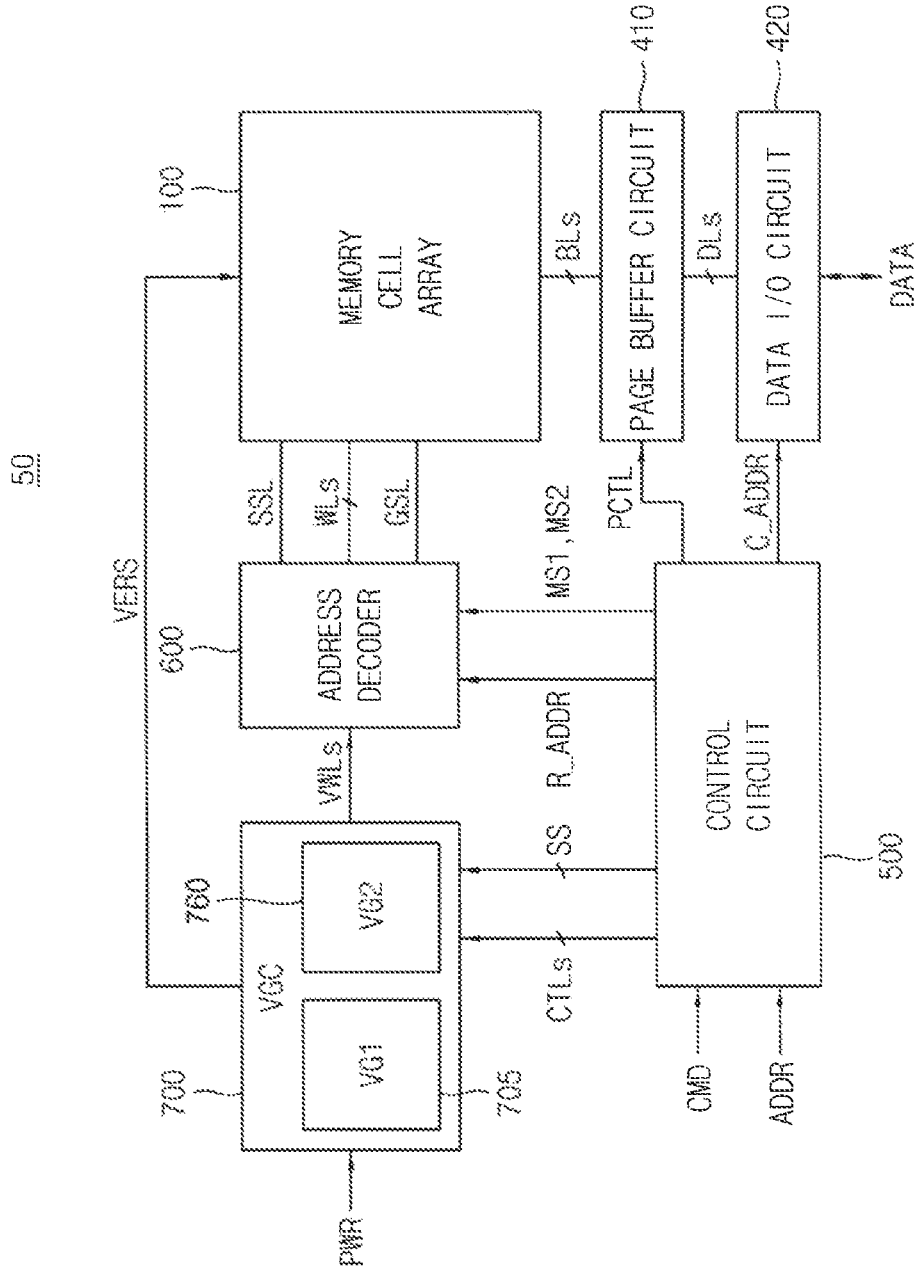
FIG. 4 is a block diagram illustrating the nonvolatile memory device in the storage device of FIG. 2 according to example embodiments.

FIG. 4 is a block diagram illustrating the nonvolatile memory device in the storage device of FIG. 2 according to example embodiments.

Referring to FIG. 4, the nonvolatile memory device 50 includes a memory cell array 100, an address decoder 600, a page buffer circuit 410, a data input/output (I/O) circuit 420, a control circuit 500 (or, alternatively, a controller) and a voltage generation circuit 700. The voltage generation circuit 700 may include a first voltage generator 705 and a second voltage generator 760.

The memory cell array 100 may be coupled to the address decoder 600 through a string selection line SSL, a plurality of word-lines WLs, and a ground selection line GSL. In addition, the memory cell array 100 may be coupled to the page buffer circuit 410 through a plurality of bit-lines BLs. The memory cell array 100 may include a plurality of memory cells coupled to the plurality of word-lines WLs and the plurality of bit-lines BLs. The memory cells are coupled to the word-lines and the word-lines may be stacked vertically on a substrate.

The address decoder 600 may transfer voltages to the string selection line SSL, the plurality of word-lines WLs, and the ground selection line GSL for operating memory cells of the memory cell array 100 in response to an address ADDR and a command CMD received from the memory controller 40 by receiving various voltages VWLs from the voltage generation circuit 700. The voltage generation circuit 700 may provide the word-line voltages VWLs to the address decoder 600 and an erase voltage VERS to the memory cell array 100 in response to control signals CTLs received from the control circuit 500.

Figure 5:
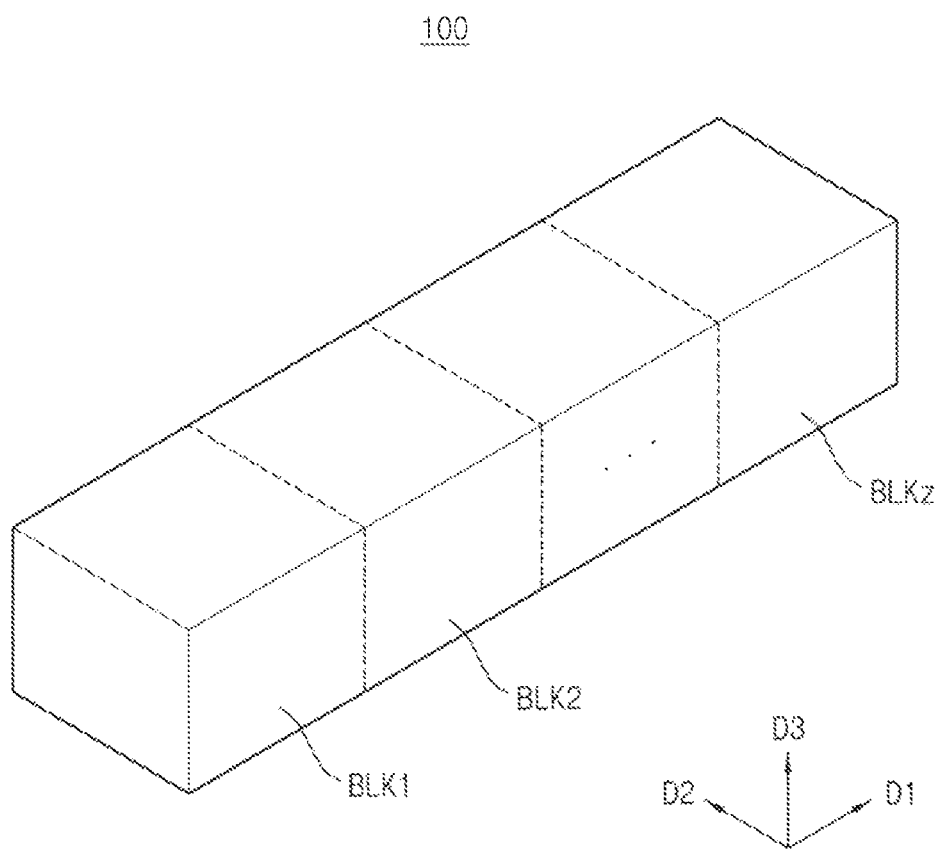
FIG. 5 is a block diagram illustrating the memory cell array in FIG. 4 according to example embodiments.

FIG. 5 is a block diagram illustrating the memory cell array in FIG. 4 according to example embodiments.

Referring to FIG. 5, the memory cell array 100 may include a plurality of memory blocks BLK1 to BLKz that extend in first through third directions D1, D2 and D3. In an example embodiment, the memory blocks BLK1 to BLKz are selected by the address decoder 600 in FIG. 4. For example, the address decoder 600 may select a memory block BLK corresponding to a block address among the memory blocks BLK1 to BLKz. The address decoder 600 may select at least one sub-block in one memory block in response to a row address R_ADDR.

Figure 6:
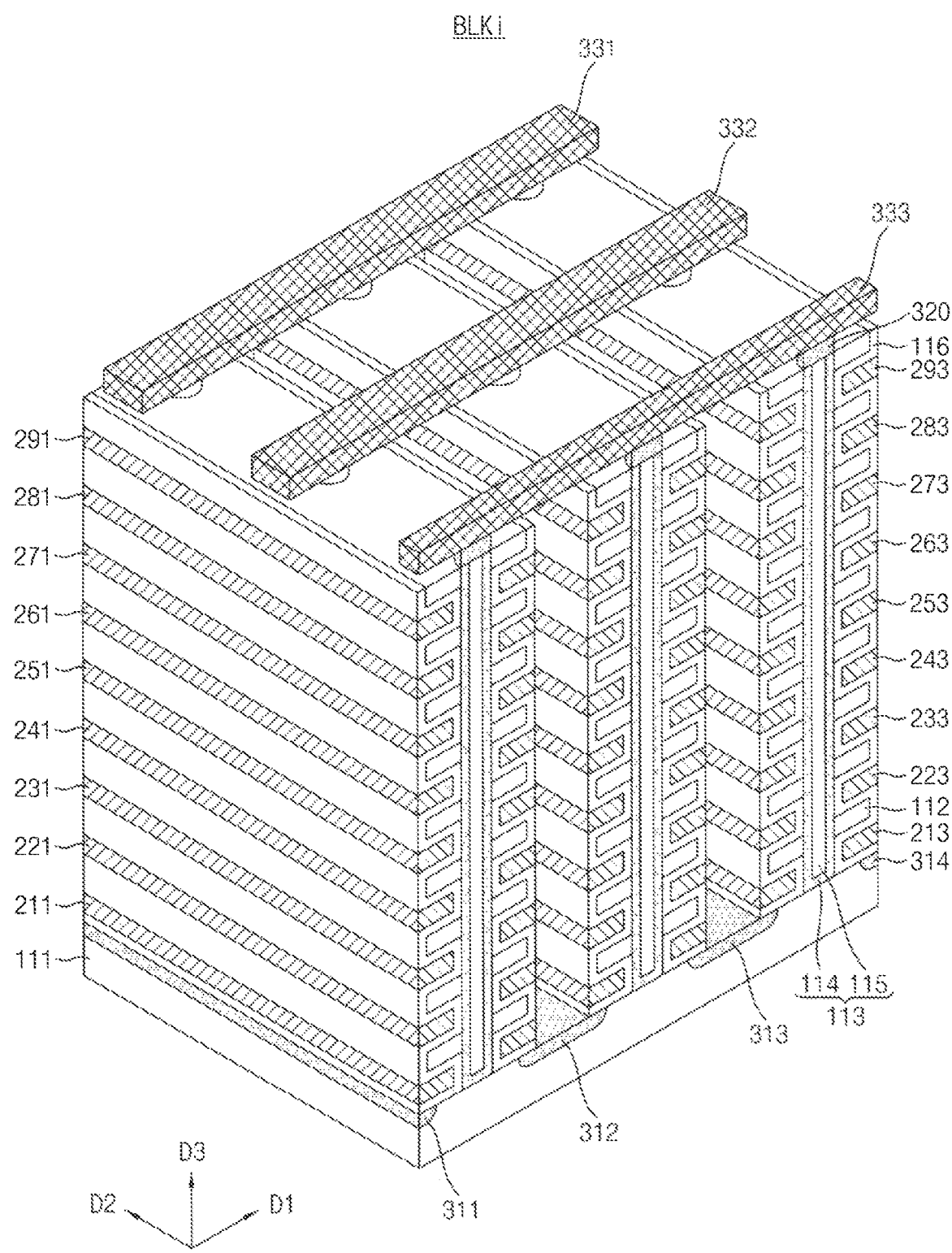
FIG. 6 is a perspective view illustrating one of the memory blocks of FIG. 5 according to example embodiments.

FIG. 6 is a perspective view illustrating one of the memory blocks of FIG. 5 according to example embodiments.

Referring to FIG. 6, a memory block BLKi includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an example embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an example embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between each of the doping regions 311 to 314. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an example embodiment, the channel layer 114 of each pillar 113 includes a p-type silicon. However, the channel layer 114 of each pillar 113 is not limited to the p-type silicon.

An inner material 115 of each pillar 113 includes an insulation material. For example, the inner material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. For example, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the first direction D1.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug.

Figure 7:
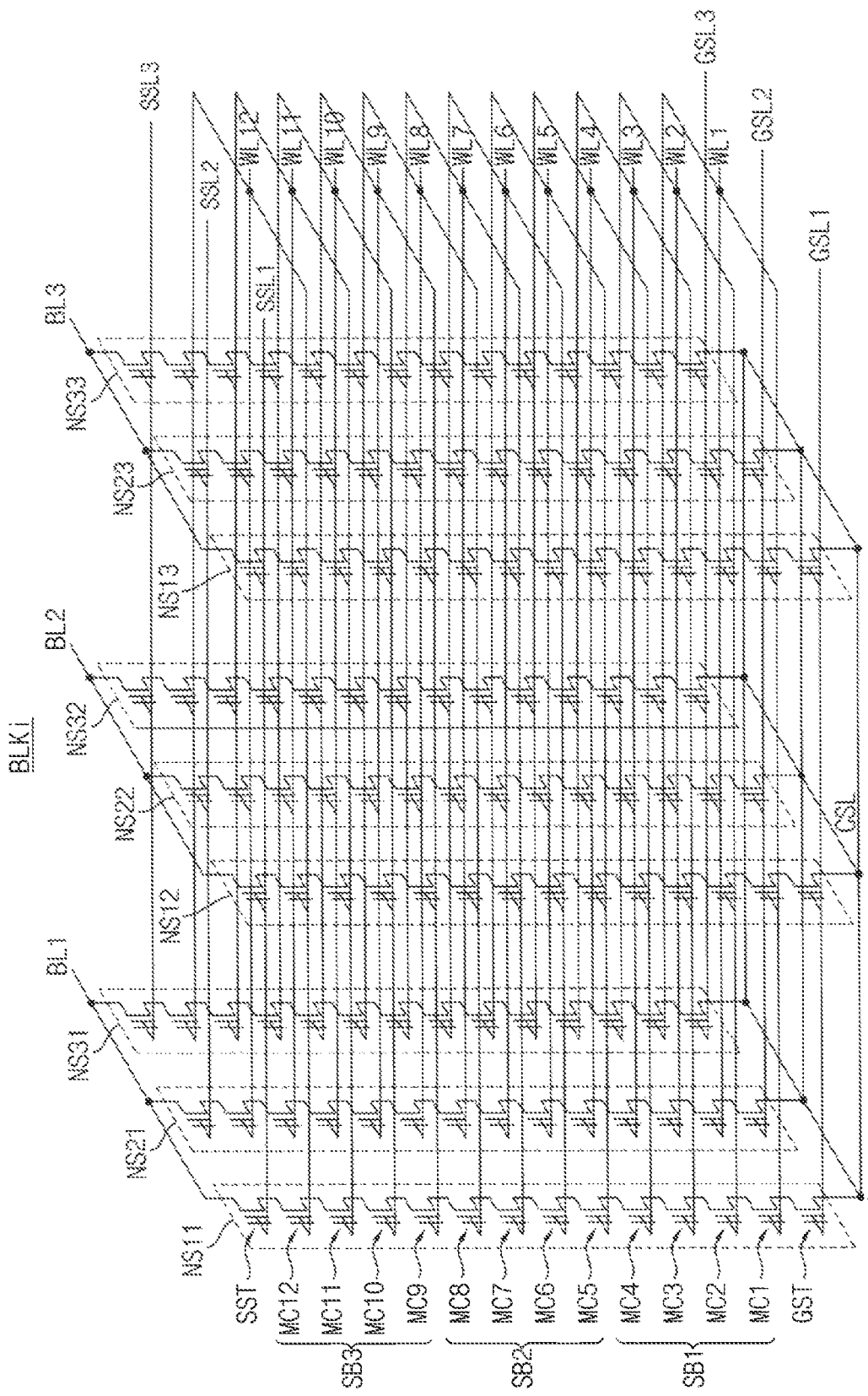
FIG. 7 is an equivalent circuit diagram illustrating the memory block of FIG. 6 according to example embodiments.

FIG. 7 is an equivalent circuit diagram illustrating the memory block of FIG. 6 according to example embodiments.

The memory block BLKi of FIG. 7 may be formed on a substrate in a three-dimensional structure (or a vertical structure). For example, a plurality of memory cell strings included in the memory block BLKi may be formed in a direction perpendicular to the substrate.

Referring to FIG. 7, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

In example embodiments, dummy memory cells connected to a dummy word-line (not shown) may be coupled between the string selection transistor SST and the memory cell MC12 and/or coupled between the ground selection transistor GST and the memory cell MC1. For example, dummy memory cells may be simultaneously formed with normal memory cells with the same processes. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is the case for normal memory cells. For instance, a dummy memory cell electrically connected to a dummy word-line may not have any connection to a bit line to transmit data there between as with normal memory cells.

Word-lines (e.g., WL1) having the same height may be commonly connected, and the ground selection lines GSL1 to GSL3 and the string selection lines SSL1 to SSL3 may be separated. In FIG. 7, the memory block BLKa is illustrated to be coupled to twelve word-lines WL1 to WL12 and three bit-lines BL1 to BL3. However, example embodiments are not limited thereto. In some example embodiments, the memory cell array 100 may be coupled to any number of word-lines and bit-lines.

According to example embodiments, the memory block BLKi is divided into a plurality of sub-blocks, indicated by representative sub-blocks SB1, SB2, and SB3, each sub-block being smaller in size than the memory block BLKi. The sub-blocks SB1, SB2 and SB3 may be divided in a word-line direction, as shown in FIG. 7. Alternatively, the sub-blocks SB1, SB2 and SB3 may be divided on the basis of bit-lines or string selection lines. The sub-blocks SB1, SB2 and SB3 in the memory block BLKa may be erased independently regardless of the reference used to divide the memory block BLKa into sub-blocks.

For example, the sub-block SB1 include memory cells coupled to the word-lines WL1, WL2, WL3 and WL4, the sub-block SB2 includes memory cells coupled to the word-lines WL5, WL6, WL7 and WL8, and the sub-block SB3 includes memory cells coupled to the word-lines WL9, WL10, WL11 and WL12, from among the memory cells included in the memory block BLKa. The memory cells included in the sub-block SB1 may be selected and erased independently of the remaining sub-blocks SB2 and SB3, and vice versa. One or more of the sub-blocks SB1, SB2, and SB3 may be selected and erased at the same time or at different times. The address decoder 600 of the nonvolatile memory device 50 (refer to FIG. 4) may provide a bias for erasing memory cells by sub-block unit.

Referring back to FIG. 4, the control circuit 500 may receive the command (signal) CMD and the address (signal) ADDR from the memory controller 40 and control an erase operation, a program operation and/or a read operation of the nonvolatile memory device 50 based on the command signal CMD and the address signal ADDR.

In example embodiments, the control circuit 500 may generate the control signals CTLs, which are used for controlling the voltage generation circuit 700, may generate a page buffer control signal PBC for controlling the page buffer circuit 410, based on the command signal CMD, and may generate a row address R_ADDR and a column address C_ADDR based on the address signal ADDR. The control circuit 500 may provide the row address R_ADDR to the address decoder 600 and provide the column address C_ADDR to the data input/output circuit 420. In addition, the control circuit 500 may provide the address decoder 600 with a first mode signal MS1 indicating that a voltage level of the substrate 111 reaches a reference level or indicates that the voltage level of the substrate 111 is maintained at a constant level during a reference time interval. In addition, the control circuit 500 may provide the address decoder 600 with a second mode signal MS2 indicating operation designated by the command CMD. In addition, the control circuit 500 may provide the voltage generation circuit 700 with a selection signal SS indicating whether the address ADDR access a normal block or a bad block.

The address decoder 600 may be coupled to the memory cell array 100 through the string selection line SSL, the plurality of word-lines WLs, and the ground selection line GSL. The voltage generation circuit 700 may generate the word-line voltages VWLs to operate the nonvolatile memory device 50, based on the control signals CTLs and the selection signal SS.

The first voltage generator 705 may generate the word-line voltages VWLs associated with a normal block or the partial normal region of the bad block. The first voltage generator 760 may generate the word-line voltages VWLs associated with the partial bad region of the bad block. When the address designates the normal block, the control circuit 500 activates the first voltage generator 705 using the selection signal SS, and when address designates the bad block, the control circuit 500 activates the first voltage generator 705 and the second voltage generator 760 using the selection signal SS. The word-line voltages VWLs may be applied to the plurality of word-lines WLs through the address decoder 600.

For example, during the sub-block erase operation, the voltage generation circuit 700 may apply an erase voltage VERS to a well of the memory block or the substrate 111 and may apply a word-line erase voltage (e.g., a ground voltage) to word-lines of a selected sub-block. During the erase verification operation, the voltage generation circuit 700 may apply an erase verification voltage to the entire word-lines of the selected sub-block or sequentially apply the erase verification voltage to word-lines of the selected sub-block on a word-line basis.

For example, during the program operation, the voltage generation circuit 700 may apply a program voltage to the selected word-line and may apply a program pass voltage to the unselected word-lines. In addition, during the program verification operation, the voltage generation circuit 700 may apply a program verification voltage to the selected word-line and may apply a verification pass voltage to the unselected word-lines. In addition, during the read operation, the voltage generation circuit 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. The page buffer circuit 410 may temporarily store data to be programmed in a selected page or data read out from the selected page of the memory cell array 100. The page buffer circuit 410 may include a plurality of page buffers. The page buffer circuit 410 may temporarily store data to be programmed in a selected page and may temporarily store data read from the selected page.

The data input/output circuit 420 may be coupled to the page buffer circuit 410 through data lines DLs. During the program operation, the data input/output circuit 420 may receive program data DATA from the memory controller 40 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 40 based on the column address C_ADDR received from the control circuit 500.

Figure 8:
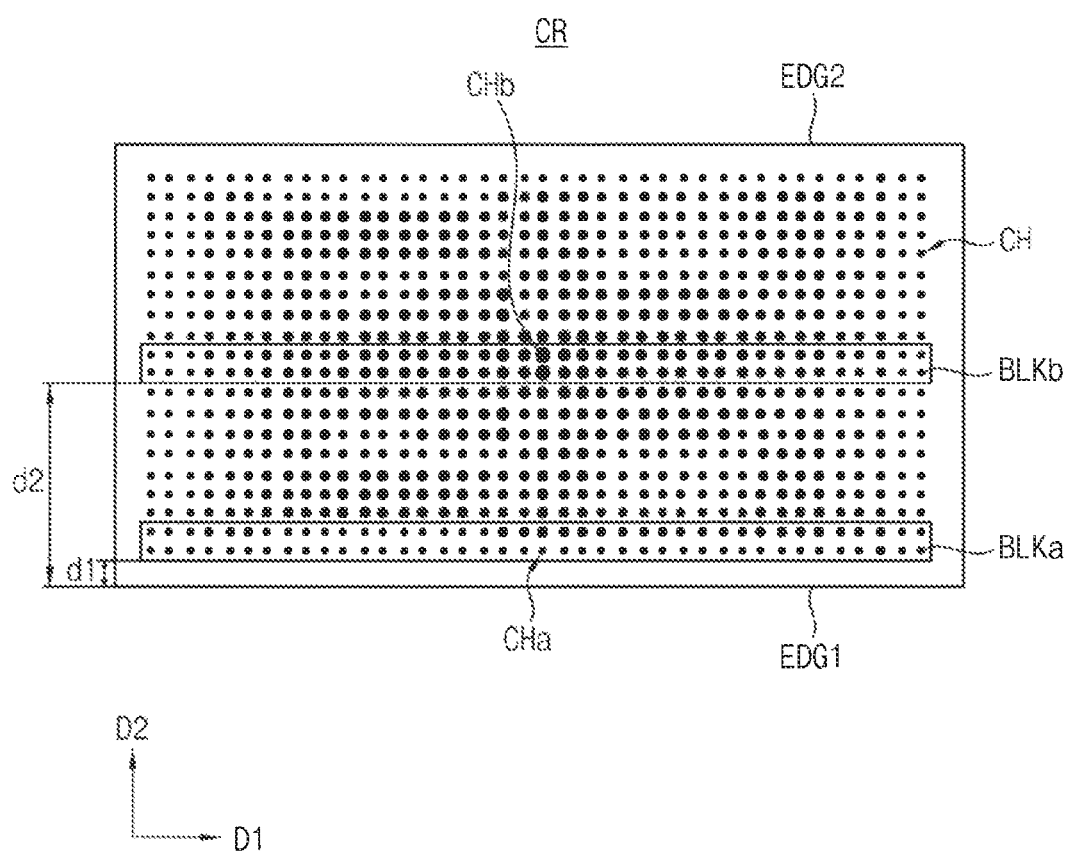
FIG. 8 illustrates a cell region in which the memory cell array of FIG. 4 is formed according to example embodiments.

FIG. 8 illustrates a cell region in which the memory cell array of FIG. 4 is formed according to example embodiments.

Referring to FIG. 8, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter DM1 of a first channel hole CHa included in the memory block BLKa may be smaller than a second diameter DM2 of a second channel hole CHb included in the memory block BLKb.

Figure 9A:
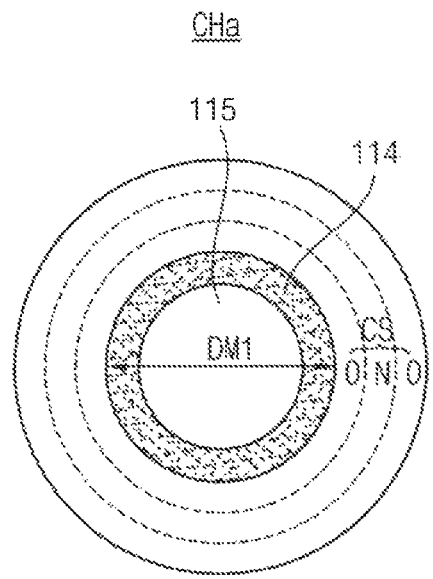
FIGS. 9A and 9B illustrate cross-sections of strings of the memory blocks BLKa and BLKb in FIG. 8, respectively.
Figure 9B:
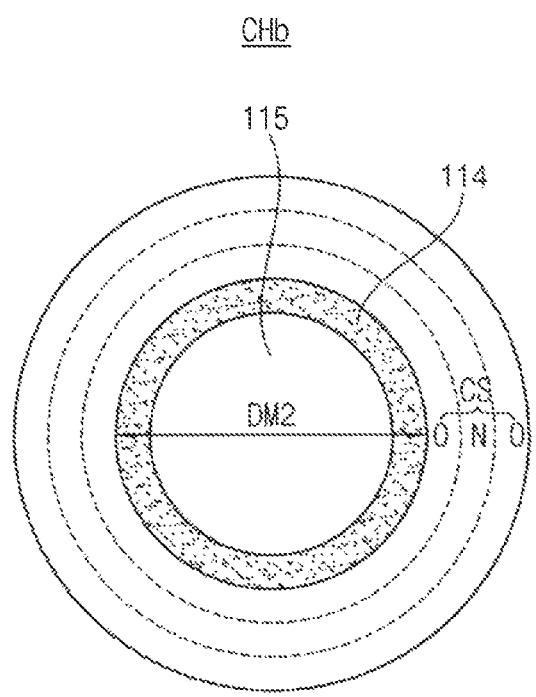

FIGS. 9A and 9B illustrate cross-sections of strings of the memory blocks BLKa and BLKb in FIG. 8, respectively.

Referring to FIG. 9A, a pillar including the channel layer 114 and the internal layer 115 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 9B, a pillar including a channel layer 114 and an internal layer 115 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a 3D memory device having a gate all around structure in which a gate electrode is disposed around a circumference of a channel hole, if a channel hole diameter is reduced, the magnitude of an electric field formed between a gate electrode (e.g., the gate electrode 211 of FIG. 6) and a channel region 114 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 8, a memory block is formed in the cell region CR to include all memory cells corresponding to one page in the first direction D1, that is, in a word-line direction, and to include some strings in the second direction D2, that is, in a bit-line direction. Thus, each memory block extends in the first direction D1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 10:
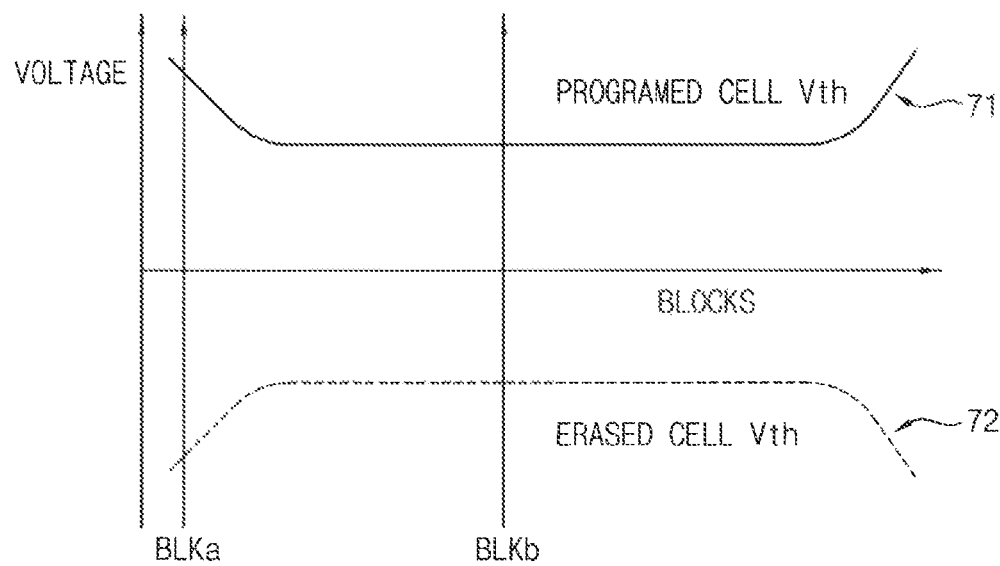
FIG. 10 is a graph showing a result of performing a program operation and an erase operation on the memory blocks in FIG. 8.

FIG. 10 is a graph showing a result of performing a program operation and an erase operation on the memory blocks in FIG. 8.

Referring to FIG. 10, a horizontal axis denotes positions of memory blocks in the second direction D2, that is, a bit-line direction, and a vertical axis denotes a threshold voltage. For example, a solid line 71 denotes a middle value of threshold voltages according to memory block positions of a programmed memory cell, and a dotted line 72 denotes a middle value of threshold voltages according to memory block positions of an erased memory cell.

As described above, the threshold voltage distribution, as indicated by the solid line 71, of programmed memory cells may have a U shape. In addition, the threshold voltage distribution, as indicated by the dotted line 72, of erased memory cells may have an inverted U.

Figure 11:
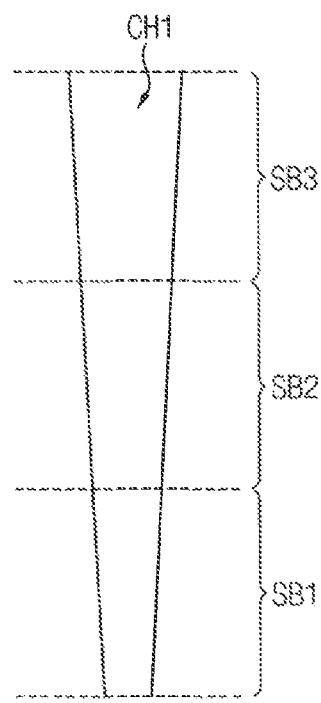
FIG. 11 illustrates an example of a vertical structure in FIG. 8.

FIG. 11 illustrates an example of a vertical structure in FIG. 8.

Referring to FIG. 11, a channel hole CH1 corresponding to a string included in a 3D memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. Thus, a diameter of the channel hole CH1 may be smaller towards the substrate.

In an example embodiment, the channel hole CH1 may be divided into three zones according to channel hole diameters. For example, a zone in which a channel hole diameter is smaller than a first value may be referred to as a first zone, and a zone in which a channel hole diameter is equal to or greater than the first value and smaller than a second value may be referred to as a second zone, and a zone in which a channel hole diameter is equal to or greater than the second value and smaller than a third value may be referred to as a third zone. The first zone corresponds to the sub-block SB1, the second zone corresponds to the sub-block SB2 and the third zone corresponds to the sub-block SB3. Therefore, memory cells in one channel hole may have different characteristics due to difference of diameters of the channel hole according to positions of sub-blocks. Therefore, program and erase speeds of memory cells included in one channel hole may be different according to positions of sub-blocks.

Figure 12:
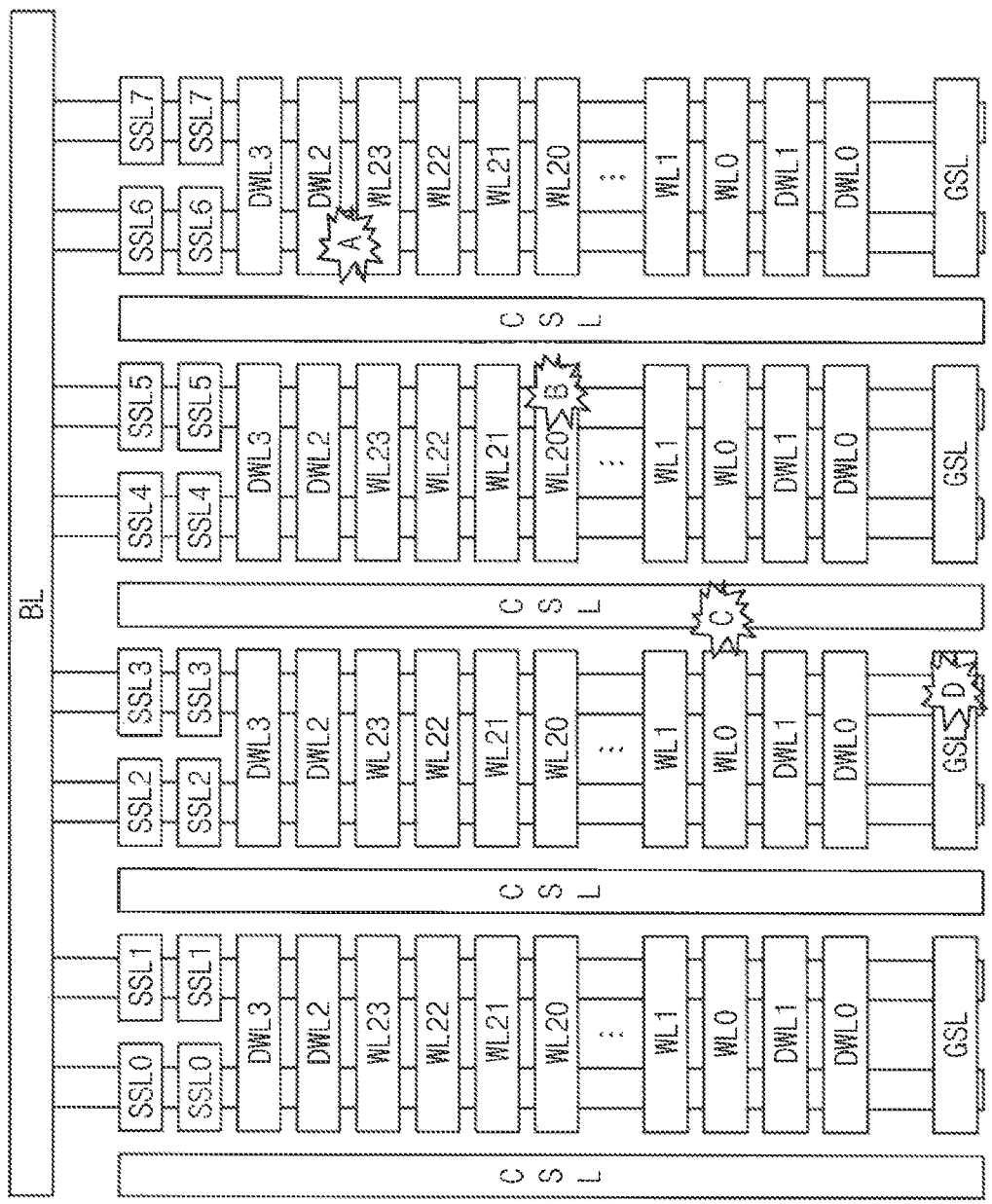
FIG. 12 is a block diagram showing examples of various progressive defects that may occur in a vertical nonvolatile memory device.

FIG. 12 is a block diagram showing examples of various progressive defects that may occur in a vertical nonvolatile memory device.

In FIG. 12, an example in which one ground selection line GSL, two lower dummy word-lines DWL0 and DWL1, 24 normal word-lines WL0~WL23, two upper dummy word lines DWL2 and DWL3, and two string selection lines SSLs are arranged from the bottom is shown. In addition, a common source line CSL of a wall type that is disposed in parallel with the word lines may be provided as a source line of a vertical channel.

In FIG. 12, a defect A denotes a case where a bridge is generated between word lines, and the defect may occur progressively due to differences between biases of the upper and lower word-lines during the writing or reading operation. In addition, a defect B denotes a case where a bridge is generated between the word-line and the channel, and a possibility of a bridge being generated between the word line and the channel is increased in the vertical NAND (VNAND) that is realized as a charge trap flash (CTF) cell. A defect C denotes a case wherein a bridge is generated between the word-line and the common source line CSL, and a possibility of a defect being generated in the 3D structure is greater than that in a planar NAND. In addition, a defect D denotes an example in which a bridge is generated between the ground selection line GSL, as well as the normal (or dummy) word-line, and the channel or common source line CSL.

Figure 13:
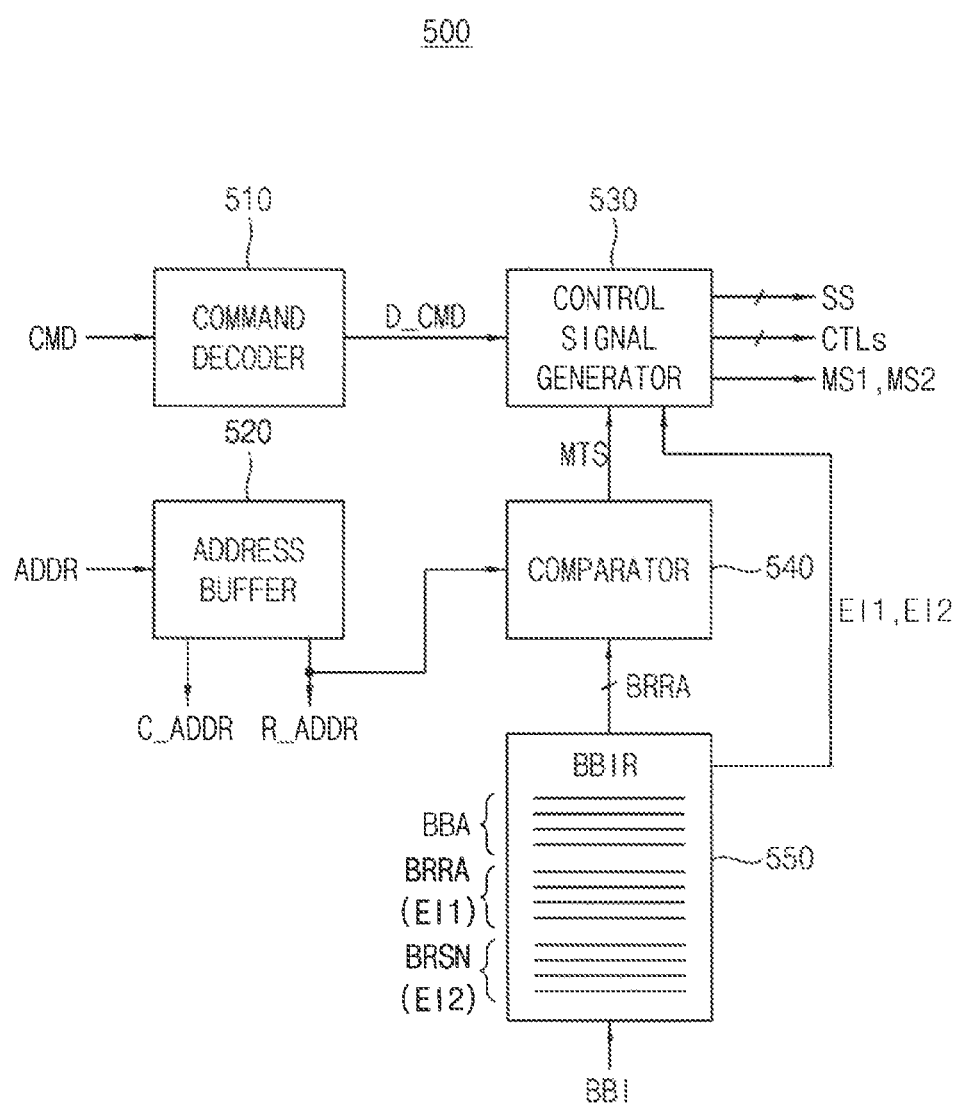
FIG. 13 is a block diagram illustrating an example of the control circuit in the nonvolatile memory device of FIG. 4 according to example embodiments.

FIG. 13 is a block diagram illustrating an example of the control circuit in the nonvolatile memory device of FIG. 4 according to example embodiments.

Referring to FIG. 13, the control circuit 500 may include a memory and processing circuitry.

The memory may include at least one of a volatile memory, non-volatile memory, random access memory (RAM), a flash memory, a hard disk drive, and an optical disk drive. The memory may store the bad block information BBI.

The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to implement a command decoder 510, an address buffer 520, a control signal generator 530, an address comparator 540. Further, the memory may be configured to store a bad block information register 550.

For example, when implementing the command decoder 510, the processing circuitry may decode the command CMD and provides a decoded command D_CMD to the control signal generator 530. The address buffer 520 receives the address signal ADDR, provides the row address R_ADDR to the address decoder 600 and the address comparator 540 and provides the column address C_ADDR to the data input/output circuit 420.

The bad block information register 550 may store the bad block information BBI, and the bad block information BBI may include a bad block address BBA of the bad block, bad region row addresses BBRA of row addresses of word-lines in partial bad region of the bad block and a bad region string number BRSN of information of a cell string in the partial bad region of the bad block. The bad block information register 550 provides the control signal generator 530 with the bad block row addresses BBRA as a first error information EI1 and provides the control signal generator 530 with the bad region string number BRSN as a second error information EI2.

When implementing the address comparator 540, the processing circuitry may compare the row address R_ADDR with the bad region row addresses BBRA stored in the bad block information register 550 and provides the control signal generator 530a with a match signal MTS indicating a result of the comparison of the row address R_ADDR with the at least one region row address BRRA.

When implementing the control signal generator 530, the processing circuitry may receive the decoded command D_CMD and the match signal MTS, generates the control signals CTLs and the selection signal SS to the voltage generation circuit 700 by referring to the first error information EI1 and the second error information EI2 when an operation directed by the decoded command D_CMD is associated with the bad block. In addition, the control signal generator 530 provides the address decoder 600 with the first mode signal MS1 associated with a voltage level of the substrate and the second mode signal MS2 indicating the operation designated by the decoded command D_CMD.

When the match signal MTS indicates that the row address R_ADDR accesses the partial normal region of the bad block, the control signal generator 530 provides the address decoder 600 with the second mode signal MS2 directing operation on the partial normal region.

Figure 14:
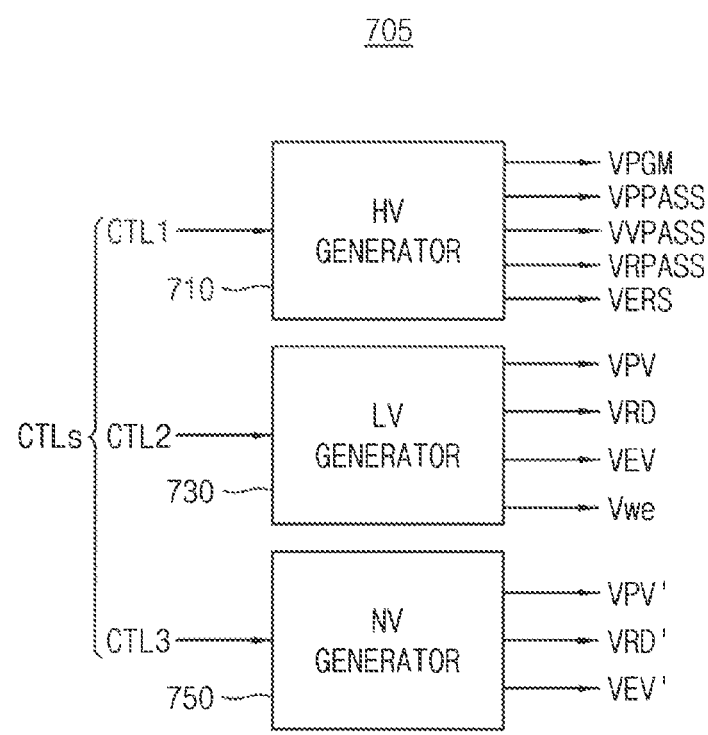
FIG. 14 is a block diagram illustrating the first voltage generator in the nonvolatile memory device of FIG. 4 according to example embodiments.

Accordingly, the control circuit 500 may improve the functioning of the storage device 30 itself by reducing (or, alternatively, preventing) reduction of the lifetime due to bad block by repairing a portion of the bad block with a partial normal region without replacing the bad block with a reserved block FIG. 14 is a block diagram illustrating the first voltage generator in the nonvolatile memory device of FIG. 4 according to example embodiments.

Referring to FIG. 14, the first voltage generator 705 may include a high voltage generator 710 and a low voltage generator 730. The voltage generation circuit 700 may further include a negative voltage generator 750.

The high voltage generator 710 may generate a program voltage PGM, a program pass voltage VPPASS, a verification pass voltage VVPASS, a read pass voltage VRPASS and an erase voltage VERS according to operations directed by the command CMD (or, a decoded command D_CMD), in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well or the substrate of the memory block. The first control signal CTL1 may include a plurality of bits which indicate the operations directed by the command CMD.

The low voltage generator 730 may generate a program verification voltage VPV, a read voltage VRD, an erase verification voltage VER and a word-line erase voltage Vwe according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 200. The word-line erase voltage Vwe may be applied to word-lines of the selected sub-block. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

The second voltage generator 760 may have a substantially same configuration as the first voltage generator 705. The first voltage generator 705 may be activated in response to the selection signal SS when the command CMD and the address ADDR designates a memory operation on the normal block and the first voltage generator 705 and the second voltage generator 760 may be activated in response to the selection signal SS when the command CMD and the address ADDR designates a memory operation on the bad block. The second voltage generator 760 may generate word-line voltages applied to the partial bad region of the bad block.

A block in a NAND flash memory may suffer from a malfunction caused by program failure or erase failure. In this case, the block is regarded as a run-time bad block and replaced with another block previously reserved. Besides a run-time bad block, there is an initial bad block that is already known as a bad block when a NAND flash memory is shipped from a factory. Generally, a small number of run-time bad blocks are generated over a long period of time when a NAND flash memory is used. In addition, a small number of initial bad blocks normally exist when the NAND flash memory is shipped from a factory. However, if a large number of run-time bad blocks are generated in a short period of time or a large number of initial bad blocks exist in the early stage, all reserved blocks may be exhausted. Therefore, it may be difficult to further use the nonvolatile memory device. For this reason as well, the lifetime of the semiconductor storage device may be limited.

In contrast, according to example embodiments, the nonvolatile memory device 50 may normally use the partial normal region in a portion of the bad block. Therefore, the nonvolatile memory device 50 may reduce (or, alternatively, prevent) reduction of the lifetime due to the bad block.

Figure 15:
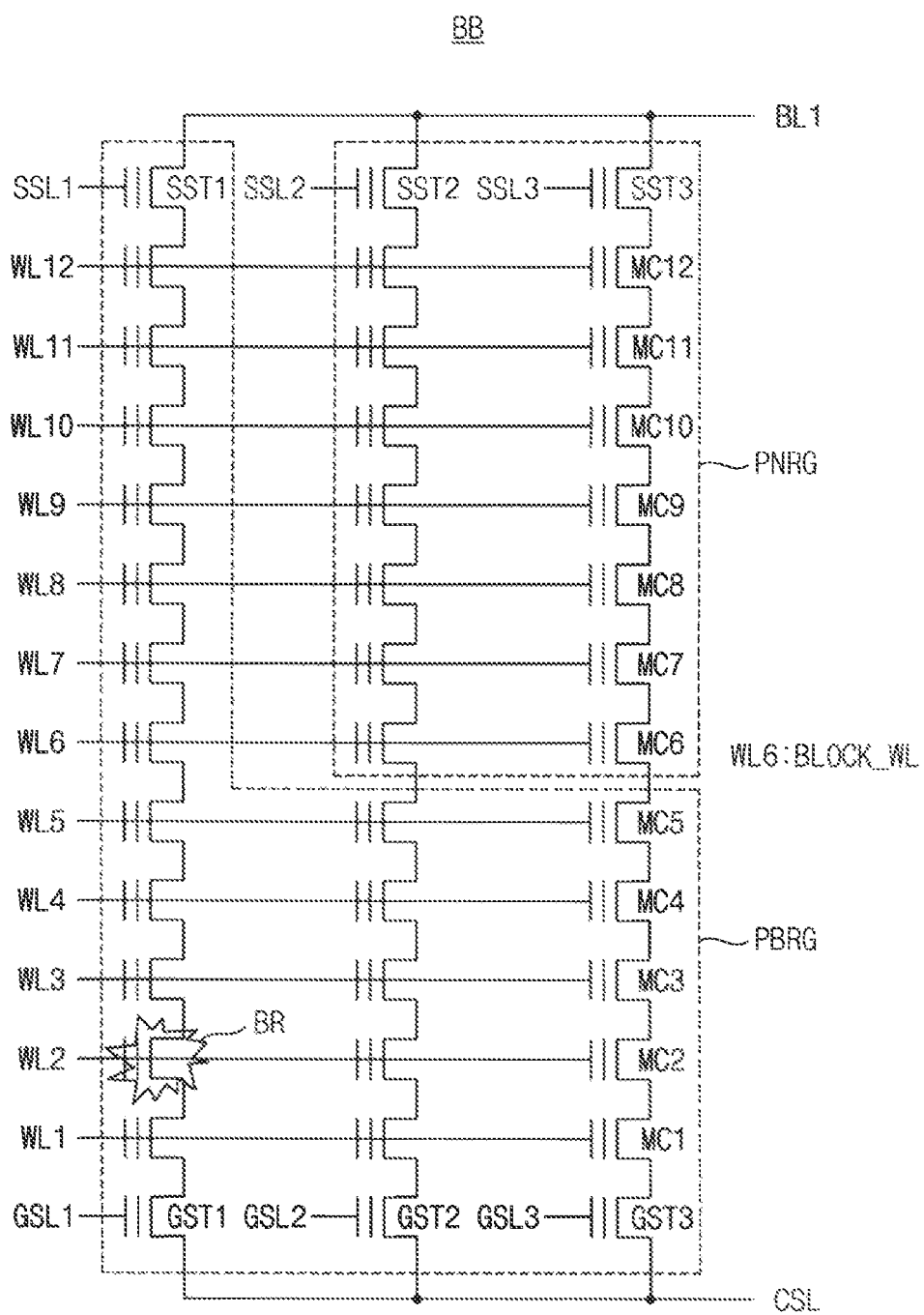
FIG. 15 illustrates that a memory block, designated as a bad block, in FIG. 7 is divided into a partial bad region and a partial normal region.

FIG. 15 illustrates that a memory block, designated as a bad block, in FIG. 7 is divided into a partial bad region and a partial normal region.

In FIG. 15, there will be descriptions on the cell string of the cell strings, which is coupled to the bit-line BL1 in the memory block BLKi of FIG. 7.

Referring to FIG. 7, when the memory block (a first memory block) BLKi is designated as the bad block, the control circuit 500 divides the bad block BB into a partial bad region PBRG and a partial normal region PNRG based on the first error information EI1 and the second error information EI2 of the bad block BB, and performs a memory operation on the partial normal region PNRG by applying a first bias condition to the a partial bad region PBRG and applying to a second bias different from the first bias condition to the a partial normal region PNRG.

The first error information EI1 may include row addresses of the word-lines WL1~WL5 associated with the uncorrectable error and the second error information EI2 may include a string number BRSN of a cell sting associated with the uncorrectable error. The string number BRSN may indicate a string selection line SSL1 coupled to the cell sting associated with the uncorrectable error. The string selection line SSL1 included in the partial bad region PBRG may be referred to as a bad string selection line, and string selection lines SSL2 and SSL3 included in the a partial normal region PNRG may be referred to as normal string selection lines. Ground selection lines GSL1, GSL2 and GSL3 included in the a partial bad region PBRG may be referred to as normal ground selection lines and at least one ground selection line (not shown) included in the a partial normal region PNRG may be referred to as a normal ground selection line.

In FIG. 15, it is assumed that a bridge BR occurs between a channel of the memory cell MC2 in the cell string NS11, coupled to the word-line WL2 and the word-line WL2 and thus the memory block BLKi is designated as the bad block BB.

The control circuit 500 may designate the word-line WL6 of the word-lines WL6~WL12 in the partial normal region PNRG, which is adjacent to the partial bad region PBRG as a blocking word-line BLOCK_WL.

FIG. 16 illustrates an erase bias condition when an erase operation is performed on the bad block.

Referring to FIGS. 15 and 16, when the command CMD and the address ADDR designates the erase operation on the first memory block MB1 i.e., the bad block BB, the control circuit 500 controls the voltage generation circuit 700 and the address decoder 600 to apply a ground voltage GND to the bad string selection line SSL1 in the partial bad region PBRG, to float the string selection lines SSL2 and SSL3 in the partial normal region PNRG, to apply a word-line erase voltage Vwe to word-lines WL6~WL12 in the partial normal region PNRG, to apply the word-line erase voltage Vwe to word-lines WL1~WL5 in the partial bad region PBRG, to float bad ground selection lines GSL1~GSL3 in the partial bad region PBNR, to float normal ground selection lines in the partial normal region PNRG from a first time point while applying the word-line erase voltage Vwe to the normal ground selection lines until the first time point and to apply the erase voltage VERS to the substrate.

FIG. 17 illustrates a program bias condition when a program operation is performed on the bad block.

In FIG. 17, it is assumed that the program operation is performed on memory cells coupled to the word-line WL9.

Referring to FIGS. 15 and 17, when the command CMD and the address ADDR designates a program operation on the partial normal region PNRG, the control circuit 500 controls the voltage generation circuit 700 and the address decoder 600 to apply the ground voltage GND to the bad string selection line SSL1 in the partial bad region PBRG, to apply a power supply voltage VDD to the string selection lines SSL2 and SSL3 in the partial normal region PNRG, to apply a first program pass voltage VPPASS1 to unselected word-lines WL6~WL8 and WL10~WL12 in the partial normal region PNRG, to apply a second program pass voltage WL1~WL5 to the word-lines WL1~WL5 in the partial bad region PBRG, to apply a program voltage PGM to a selected word-line WL6, to apply the ground voltage GND to the bad ground selection lines GSL1~GSL3 in the partial bad region PBNR, and to apply the ground voltage GND to the normal ground selection lines in the partial normal region PNRG. In this case, when memory cells in the bad block BB is capable of storing M-bit data, N-bit data is programmed in memory cells coupled to the word-lines WL7~WL12 and signal bit data or same data bit is programmed in memory cells coupled to the blocking word-line WL6.

A level of the second program pass voltage VPPASS2 is different from a level of the first program pass voltage VPPASS1, because capacitance in the cell string coupled to the bad sting selection line SSL1 increase due the bridge BR between the word-line WL2 and the channel. Therefore, a first word-line set-up time associated with the word-lines WL1~WL5 in the partial bad region PBRG is greater than a second word-line set-up time associated with the word-lines WL6~WL12 in the partial normal region PNRG.

FIG. 18 illustrates a read bias condition when a program operation is performed on the bad block.

In FIG. 18, it is assumed that the read operation is performed on memory cells coupled to the word-line WL9.

Referring to FIGS. 15 and 18, when the command CMD and the address ADDR designates a read operation om the partial normal region PNRG, the control circuit 500 controls the voltage generation circuit 700 and the address decoder 600 to apply the ground voltage GND to the bad string selection line SSL1 in the partial bad region PBRG, to apply the power supply voltage VDD to the string selection lines SSL2 and SSL3 in the partial normal region PNRG, to apply a first read pass voltage VRPASS1 to unselected word-lines WL6~WL8 and WL10~WL12 in the partial normal region PNRG, to apply a second read pass voltage VRPASS2 to the word-lines WL1~WL5 in the partial bad region PBRG, to apply a read voltage VRD to a selected word-line WL6, to apply the ground voltage GND to the bad ground selection lines GSL1~GSL3 in the partial bad region PBNR, and to apply the ground voltage GND to the normal ground selection lines in the partial normal region PNRG.

A level of the second read pass voltage VRPASS2 is different from a level of the first read pass voltage VRPASS1, because capacitance in the cell string coupled to the bad sting selection line SSL1 increase due the bridge BR between the word-line WL2 and the channel.

Figure 19:
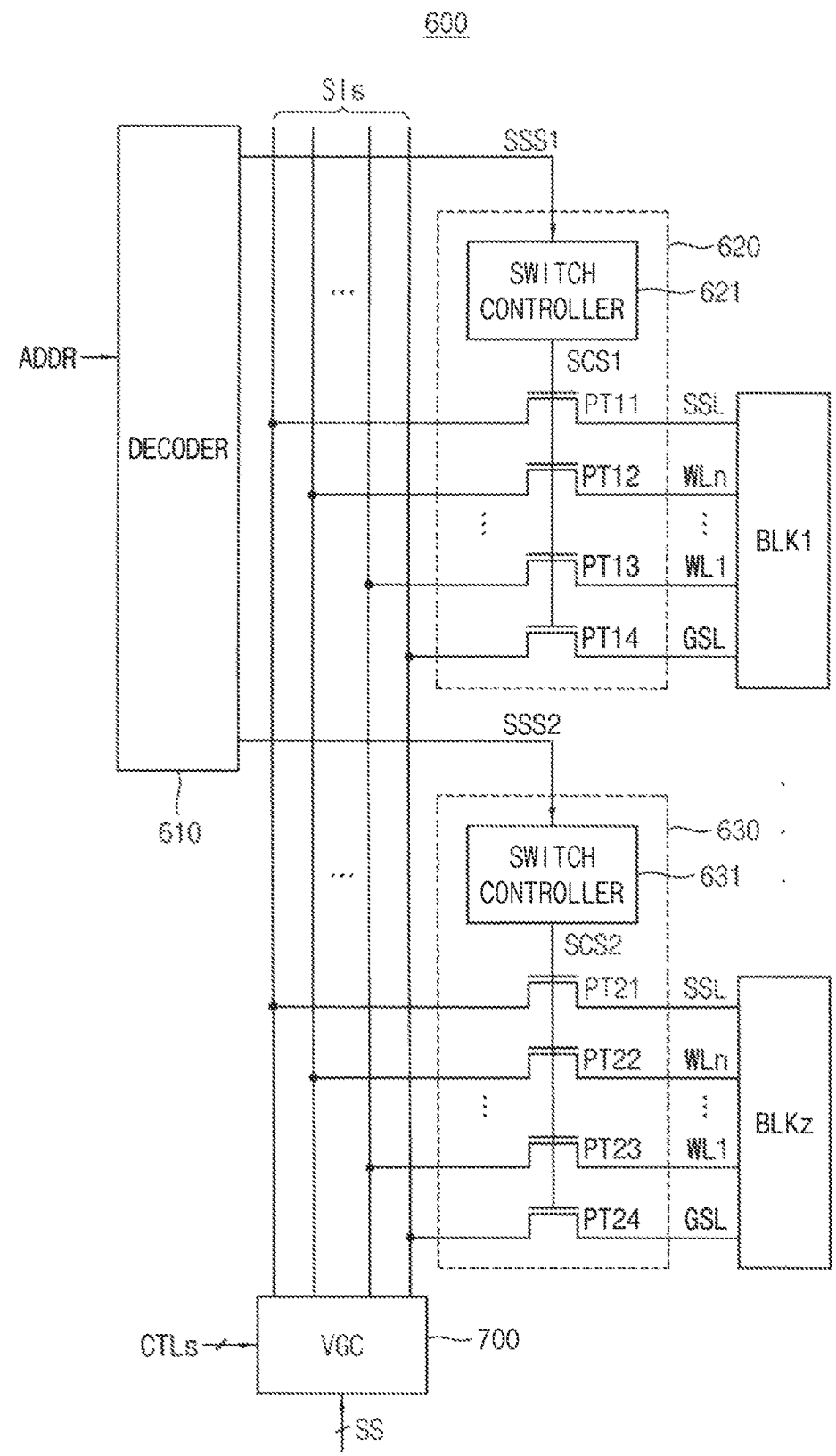
FIG. 19 is a block diagram illustrating the address decoder in the nonvolatile memory device of FIG. 4 according to example embodiments.

FIG. 19 is a block diagram illustrating the address decoder in the nonvolatile memory device of FIG. 4 according to example embodiments.

In FIG. 19, the memory blocks BLK1~BLKz and the voltage generation circuit 700 are illustrated together with the address decoder 600 for convenience of explanation. Referring to FIG. 19, the address decoder 600 includes a decoder 610, a first switch circuit 620 and a second switch circuit 630.

The decoder 610 receives the address ADDR (e.g., the row address R_ADDR), the first mode signal MS1 and the second mode signal MS2, generates a first switch selection signal SSS1 and a second switch selection signal SSS2 according to a memory block directed by the address ADDR, the level of the substrate voltage or a maintaining time of the level of the substrate voltage indicated by the first mode signal MS1 and the memory operation indicated by the second mode signal MS2 and provides the first switch selection signal SSS1 and the second switch selection signal SSS2 to the first switch circuit 620 and the second switch circuit 630, respectively. As an example, each of the first switch selection signal SSS1 and the second switch selection signal SSS2 may have a plurality of selection signals for selecting a block among the plurality of blocks in the memory cell array 100.

The first switch circuit 620 and the second switch circuit 630 may be coupled to a plurality of selection lines Sls coupled to the voltage generation circuit 700. The first switch circuit 620 is coupled to the memory block BLK1 through at least one string selection line SSL, a plurality of word-lines WL1~WLn and at least one ground selection line GSL. The second switch circuit 630 is coupled to the memory block BLKz through at least one string selection line SSL, a plurality of word-lines WL1~WLn and at least one ground selection line GSL.

The first switch circuit 620 includes a switch controller 621 and a plurality of pass transistors PT11~PT14 coupled to the string selection line SSL, the word-lines WL1~WLn and the ground selection line GSL of the memory block BLK1. The switch controller 621 may control turn-on and turn-off of the pass transistors PT11~PT14 by providing a first switching control signal SCSI to the pass transistors PT11~PT14 in response to the first switch selection signal SSS1. The second switch circuit 630 includes a switch controller 631 and a plurality of pass transistors PT21~PT24 coupled to the string selection line SSL, the word-lines WL1~WLn and the ground selection line GSL of the memory block BLKz. The switch controller 631 may control turn-on and turn-off of the pass transistors PT21~PT24 by providing a second switching control signal SCS2 to the pass transistors PT21~PT24 in response to the second switch selection signal SSS2.

The voltage generation circuit 700 may include the first voltage generator 705 and the second voltage generator 760 as described with reference to FIG. 4. The first voltage generator 705 may generate word-line voltages applied to the normal block or the partial normal region and the second voltage generator 760 may generate word-line voltages applied to the partial bad region PBRG.

Figure 20:
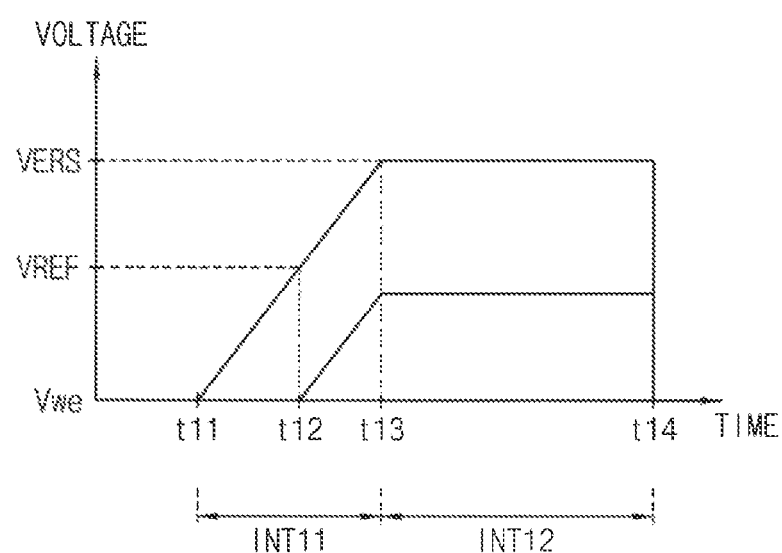
FIG. 20 illustrates a change in voltage of the bad block and a change in voltage of the substrate when the erase bias condition of FIG. 16 is employed.

FIG. 20 illustrates a change in voltage of the bad block and a change in voltage of the substrate when the erase bias condition of FIG. 16 is employed.

Referring to FIGS. 15, 16 and 20, during the erase operation on the bad block BB, the control circuit 500 controls voltage generation circuit 700 and the address decoder 600 to apply the word-line erase voltage Vwe to the word-lines WL1~WL5 of in the partial bad region PBRG and the word-line WL6~WL12 in the partial normal region PNRG and to apply the erase voltage VRES to the substrate 111. The address decoder 600 applies the word-line erase voltage Vwe to the word-lines WL1~WL5 in the partial bad region PBRG during a first interval INT11 in which the voltage level of the substrate 111 increases with a constant slope in response to the erase voltage VERS applied to the substrate 111. The first interval INT11 starts from a timing point t11 at which the erase voltage VERS is applied to the substrate 111 and ends at a timing point t13 at which the voltage level of the substrate 111 reaches a voltage level of the erase voltage VERS. The address decoder 600 floats the word-lines WL1~WL5 in the partial bad region PBRG at a time point t12 in the first interval INT11 while the word-line erase voltage Vwe is applied to the word-lines WL1~WL5 in the partial bad region PBRG.

When the word-lines WL1~WL5 in the partial bad region PBRG are floated at the timing point t12, each voltage level of the word-lines WL1~WL5 in the partial bad region PBRG follows the voltage level of the substrate 111. The timing point t12 may be a time point at which the voltage level of the substrate 111 reaches a reference level VREF in response to the erase voltage VERS applied to the substrate 111. The voltage level of each of the word-lines WL1~WL5 in the partial bad region PBRG is maintained as a particular level during a second interval INT12. The second interval INT12 starts from the timing point t13 and ends at a timing point t14.

Figure 21:
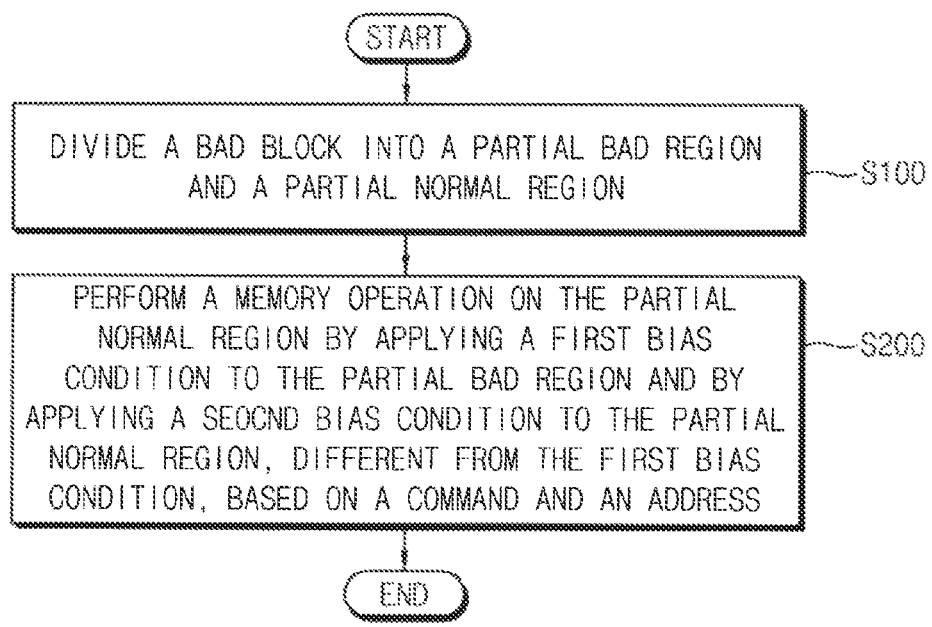
FIG. 21 is a flow chart illustrating a method of operating a nonvolatile memory device according to example embodiments.

FIG. 21 is a flow chart illustrating a method of operating a nonvolatile memory device according to example embodiments.

Referring to FIGS. 2 through 21, the nonvolatile memory device 50 may include the memory cell array 300 including the plurality of memory blocks BLK1~BLKz, and may also include a control circuit 500. The plurality of memory blocks BLK1-BLKz may each including a plurality memory cells coupled to word-lines which are stacked vertically on a substrate, respectively.

In operation S100, the control circuit 500 may divide a first memory block of the plurality of memory blocks BLK1~BLKz into a partial bad region PBRG and a partial normal region based PNRG on error information of uncorrectable error of the first memory block which is designated as a bad block BB.

In operation S200, the control circuit 500 may perform a memory operation on the partial normal region PNRG by applying a first bias condition to the partial bad region PBRG and by applying a second bias condition different from the first bias condition to the partial normal region PNRG, based on an command CMD and an address ADDR provided from an outside. The memory operation on the partial normal region PNRG may be one of a program operation, a read operation and an erase operation.

Therefore, the nonvolatile memory device 50 may reduce (or, alternatively, prevent) reduction of the lifetime due to bad block by repairing a portion of the bad block with a partial normal region without replacing the bad block with a reserved block.

Figure 22:
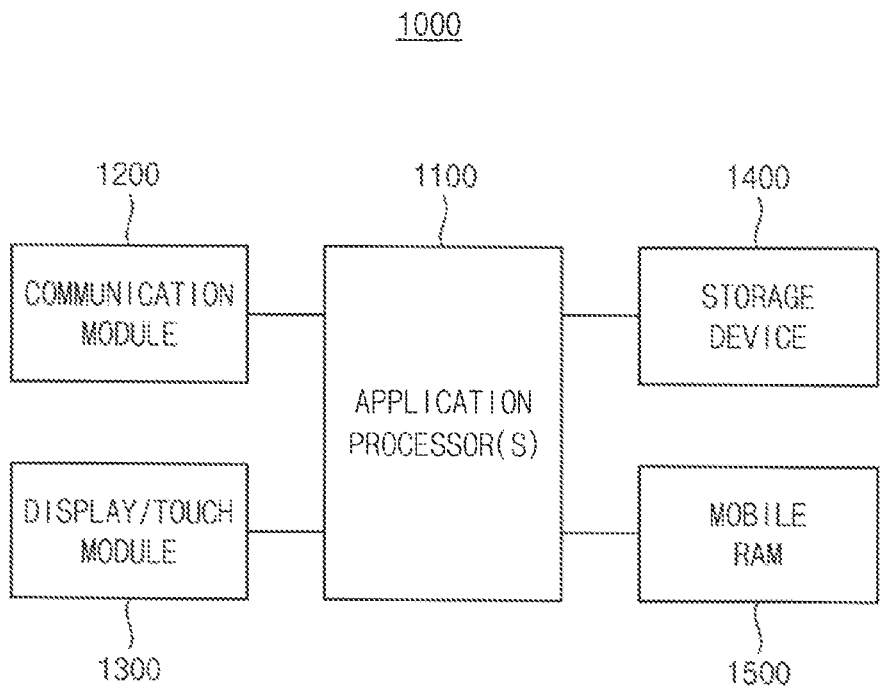
FIG. 22 is a block diagram illustrating a mobile device according to example embodiments.

FIG. 22 is a block diagram illustrating a mobile device according to example embodiments.

Referring to FIG. 22, a mobile device 1000 may include an application processor 1100, a communication module 1200, a display/touch module 1300, a storage device 1400, and a mobile RAM 1500.

The application processor 1100 controls operations of the mobile device 1000. The communication module 1200 is implemented to perform wireless or wired communications with an external device. The display/touch module 1300 is implemented to display data processed by the application processor 1100 or to receive data through a touch panel. The storage device 1400 may be implemented to store user data.

The storage device 1400 may be eMMC, SSD, UFS device, etc. The storage device 1400 may employ the storage device 30 of FIG. 2. The storage device 1400 may include a memory controller and at least one nonvolatile memory device. The at least one nonvolatile memory device may include the nonvolatile memory device 50 of FIG. 4. The mobile RAM 1500 temporarily stores data used for processing operations of the mobile device 1000.

A nonvolatile memory device or a storage device according to example embodiments may be packaged using various package types or package configurations.

Example embodiments may be applied to various electronic devices including a nonvolatile memory device.

According to one or more example embodiments, the units and/or devices described above including elements of the storage device 30 such as the control circuit 500 and sub-elements thereof such as the command decoder 510, address buffer 520, control signal generator 530, comparator 540 and bad block information register 550 may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims.

What is claimed is:

1. A nonvolatile memory device comprising:
   a memory cell array including a plurality of memory blocks, the plurality of memory blocks including a plurality memory cells coupled to word-lines, the word-lines being stacked vertically on a substrate; and
   a controller configured to,
      divide a first memory block of the plurality of memory blocks into a partial bad region and a partial normal region based on error information associated with an error in the first memory block such that the first memory block is designated as a bad block, and
      perform a memory operation on the partial normal region by applying a first bias condition to the partial bad region and applying a second bias condition to the partial normal region, based on a command and an address, the first bias condition being different from the second bias condition.

2. The nonvolatile memory device of claim 1, wherein the error information includes a first error information and a second error information, the first error information being related to word-lines associated with the error in the first memory block, and the second error information being related to a cell string associated with the error in the first memory block.

3. The nonvolatile memory device of claim 2, wherein the partial bad region includes memory cells coupled to at least two word-lines associated with the error and at least one cell string associated with the error.

4. The nonvolatile memory device of claim 2, wherein the controller is configured to,
   designate at least one of the word-lines in the partial normal region as a blocking word-line such that the blocking word-line is adjacent to the partial bad region, and
   program a single bit or same data bit in memory cells coupled to the blocking word-line.

5. The nonvolatile memory device of claim 2, furthering comprising:
   a voltage generation circuit configured to generate word-line voltages in response to control signals and a selection signal; and
   an address decoder configured to provide the word-line voltages to the partial bad region and the partial normal region based on a row address included in the address.

6. The nonvolatile memory device of claim 5, wherein the controller includes:
   a memory configured to store bad row addresses of word-lines in the partial bad region and a bad cell string number of at least one cell string in the partial bad region, the bad row addresses being associated with the first error information and the bad cell string number being associated with the second error information; and
   processing circuitry configured to,
      decode the command to provide a decoded command,
      generate a match signal based on the row address and the bad row addresses; and
      generate, in response to the decoded command and the match signal, the control signals, a first mode signal and a second mode signal based on the first error information and the second error information, the address decoder being controllable via the control signals, the first mode signal and the second mode signal.

7. The nonvolatile memory device of claim 5, wherein, when the command designates an erase operation on the bad block, the controller is configured to control the voltage generation circuit and the address decoder to:
   apply a ground voltage to at least one bad string selection line coupled to at least one cell string in the partial bad region,
   float at least one normal string selection line coupled to at least one cell string in the partial normal region,
   apply a word-line erase voltage to the word-lines in the partial normal region,
   apply the word-line erase voltage to the word-lines in the partial bad region,
   float at least one bad ground selection line in the partial bad region,
   float at least one normal ground selection line in the partial normal region from a first time point while applying the word-line erase voltage to the at least one normal ground selection line until the first time point, and
   apply an erase voltage to the substrate.

8. The nonvolatile memory device of claim 5, wherein, when the command designates a program operation on a selected word-line in the partial normal region, the controller is configured to control the voltage generation circuit and the address decoder to:
   apply a ground voltage to at least one bad string selection line coupled to at least one cell string in the partial bad region,
   apply a power supply voltage to at least one normal string selection line coupled to at least one cell string in the partial normal region,
   apply a program voltage to the selected word-line,
   apply a first program pass voltage to unselected word-lines in the partial normal region,
   apply a second program pass voltage to word-lines in the partial bad region, the second program pass voltage being a different voltage level from the first program pass voltage, and
   apply a ground voltage to at least one bad ground selection line in the partial bad region and to at least one normal ground selection line in the partial normal region.

9. The nonvolatile memory device of claim 8, wherein the controller is configured to,
   designate at least one of the word-lines in the partial normal region as a blocking word-line such that the blocking word-line is adjacent to the partial bad region,
   program a single bit or same data bit in first memory cells coupled to the blocking word-line, and
   program N-bit second memory cells in the partial normal region, except the first memory cells coupled to the blocking word-line, N being a natural number greater than 1.

10. The nonvolatile memory device of claim 5, wherein, when the command designates a read operation on a selected word-line in the partial normal region, the controller is configured to control the voltage generation circuit and the address decoder to:
- apply a ground voltage to at least one bad string selection line coupled to at least one cell string in the partial bad region,
- apply a power supply voltage to at least one normal string selection line coupled to at least one cell string in the partial normal region,
- apply a first read pass voltage to unselected word-lines in the partial normal region,
- apply a read voltage to the selected word-line,
- apply a second read pass voltage to word-lines in the partial bad region, the second read pass voltage being a different voltage level from the first read pass voltage,
- apply a ground voltage to at least one bad ground selection line in the partial bad region, and
- apply the ground voltage to at least one normal ground selection line in the partial normal region.

11. The nonvolatile memory device of claim 5, wherein the voltage generation circuit includes:
- a first voltage generator configured to generate the word-line voltages applied to a normal block or the partial normal region, in response to the control signals and the selection signal; and
- a second voltage generator configured to generate the word-line voltages applied to the partial bad region, in response to the control signals and the selection signal.

12. The nonvolatile memory device of claim 1, wherein a number of word-lines and a number of cell strings included in the partial bad region vary based on a position at which the first memory block is formed in the memory cell array.

13. The nonvolatile memory device of claim 1, wherein a first word-line set-up time for word-lines in the partial bad region is greater than a second word-line set-up time for word-lines in the partial normal region.

14. A method of operating a nonvolatile memory device, the nonvolatile memory device including a memory cell array having a plurality of memory blocks, each of the memory blocks including a plurality memory cells coupled to word-lines respectively, the word-lines being stacked vertically on a substrate, the method comprising:
- dividing a first memory block of the plurality of memory blocks into a partial bad region and a partial normal region based on error information associated with an error in the first memory block such that the first memory block is designated as a bad block; and
- performing a memory operation on the partial normal region by applying a first bias condition to the partial bad region and by applying a second bias condition to the partial normal region, based on an command and an address, the first bias condition being different from the second bias condition.

15. The method of claim 14, wherein the error information includes a first error information and a second error information, the first error information being related to each of word-lines associated with the error in the first memory block, and the second error information being related to each of cell strings associated with the error in the first memory block, wherein the method further comprising:
- designating at least one of the word-lines in the partial normal region as a blocking word-line such that the blocking word-line is adjacent to the partial bad region; and
- programming a single bit or same data bit in memory cells coupled to the blocking word-line.

16. The method of claim 14, wherein, when the command designates an erase operation on the bad block, the performing the memory operation includes:
- applying a ground voltage to at least one bad string selection line coupled to at least one cell string in the partial bad region;
- floating at least one normal string selection line coupled to at least one cell string in the partial normal region;
- applying a word-line erase voltage to word-lines in the bad block;
- floating at least one bad ground selection line in the partial bad region;
- floating at least one normal ground selection line in the partial normal region from a first time point while applying the word-line erase voltage to the at least one normal ground selection line until the first time point; and
- applying an erase voltage to the substrate.

17. The method of claim 14, wherein, when the command designates a program operation on a selected word-line in the partial normal region, the performing the memory operation includes:
- applying a ground voltage to at least one bad string selection line coupled to at least one cell string in the partial bad region;
- applying a power supply voltage to at least one normal string selection line coupled to at least one cell string in the partial normal region;
- applying a program voltage to the selected word-line;
- apply a first program pass voltage to unselected word-lines in the partial normal region;
- applying a second program pass voltage to word-lines in the partial bad region; and
- applying a ground voltage to at least one bad ground selection line in the partial bad region and to at least one normal ground selection line in the partial normal region.

18. The method of claim 14, wherein, when the command designates a read operation on a selected word-line in the partial normal region, the performing the memory operation includes:
- applying a ground voltage to at least one bad string selection line coupled to at least one cell string in the partial bad region;
- applying a power supply voltage to at least one normal string selection line coupled to at least one cell string in the partial normal region;
- applying a first read pass voltage to unselected word-lines in the partial normal region;
- applying a read voltage to the selected word-line;
- applying a second read pass voltage to word-lines in the partial bad region;
- applying a ground voltage to at least one bad ground selection line in the partial bad region; and
- applying the ground voltage to at least one normal ground selection line in the partial normal region.

19. A storage device comprising:
a memory controller; and
at least one nonvolatile memory device including,
- a memory cell array including a plurality of memory blocks, each including a plurality memory cells coupled to word-lines respectively, the word-lines being stacked vertically on a substrate; and
- a controller configured to,
  receive, from the memory controller, bad block information associated with an error in a first memory block of the plurality of memory blocks, the first memory block being designated as a bad block, divide the bad block into a partial bad region and a partial normal region based on the bad block information, and perform a memory operation on the partial normal region by applying a first bias condition to the partial bad region and by applying a second bias condition to the partial normal region based on the bad block information, the first bias condition being different from the second bias condition.

* * * * *